United States Patent [19]
Kvaas et al.

[11] Patent Number: 6,133,739
[45] Date of Patent: Oct. 17, 2000

[54] ELECTRIC BATTERY MONITORING SYSTEMS

[75] Inventors: Robert E. Kvaas, Goleta; Stanley H. Garrow, Lompoc, both of Calif.

[73] Assignee: Hendry Mechanical Works, Goleta, Calif.

[21] Appl. No.: 09/488,433

[22] Filed: Jan. 20, 2000

[51] Int. Cl.[7] .................................................. G01N 27/46
[52] U.S. Cl. .............................................................. 324/426
[58] Field of Search ............................................... 324/426

[56] References Cited

U.S. PATENT DOCUMENTS

| | | | |
|---|---|---|---|
| 5,684,404 | 11/1997 | Millar | 324/426 |
| 5,796,239 | 8/1998 | Van Phuoc | 320/107 |

*Primary Examiner*—Shawn Riley
*Assistant Examiner*—Pia Tibbits
*Attorney, Agent, or Firm*—Benoit Law Corporation

[57] ABSTRACT

A method of monitoring electric battery capacity effects evaluation of battery capacity in terms of battery current and battery voltage in a succession of monitoring cycles, scales down an influence of battery current on the evaluation as the succession of monitoring cycles, progresses, and scales up an influence of battery voltage on such evaluation as the succession of monitoring cycles progresses. A similar method effects an assessment of battery capacity during alternating battery discharge operations and battery charging operations over a recurrence of monitoring cycles, detects a decline of attainable battery charge capacity during battery charging operations, and modifies its assessment in response to the detected decline of attainable battery charge capacity. A related method effects evaluation of battery capacity during battery discharges in a succession of monitoring cycles, effects an adjustment of such evaluation of battery capacity in a succession of further monitoring cycles during battery charge restoration between battery discharges, and effects a modification of the adjustment during a decline of battery charging efficiency in a vicinity of full charge restoration.

51 Claims, 4 Drawing Sheets

ELECTRIC BATTERY MONITORING SYSTEMS

FIELD OF INVENTION

The subject invention relates to electric battery monitoring systems, including methods and apparatus for monitoring capacity of electric batteries.

BACKGROUND

Monitoring of electric battery capacity is important in many applications, both in terms of remaining charge in a battery and in terms of storage capability of secondary batteries. By way of example, it is often important for a given task to know whether there is sufficient charge in that battery for performance of that task. Another example is the importance of knowing the point of time at which recharging of a discharging secondary battery should commence. This requires a prediction as to when a battery will be exhausted.

Alternatively or additionally, it is important to monitor the lifetime of a secondary battery or otherwise to monitor the storage capability of secondary batteries that are being charged and discharged over long periods of time.

Yet monitoring battery capacity fairly accurately has remained a difficult task, To illustrate the problem by way of example and not by way of limitation, capacity of lead acid storage batteries is specified in Ampere-Hours (AH) at a given discharge rate, typically 8 hours. For example a 64 AH battery will deliver 8 Amperes for 8 hours. This, however, is not linearly proportional. For example, that same battery will not deliver 16 Amperes for 4 hours as might have been expected from the 64 AH battery rating. Rather, at a discharge rate of 16 Amperes, that battery will be exhausted after substantially less than 4 hours. Conversely, that same battery will deliver 2 Amperes for substantially longer than 32 hours.

The problem is further complicated in that battery capacity is affected by other factors besides discharge rate. These factors include number of discharge cycles, depth of discharges, temperature and float voltage. These additional factors make capacity prediction much more difficult. A battery that has been discharged many times may behave as if it were being discharged at a certain rate when it in fact is being discharged at a very different rate. These and other known factors make it impossible to devise an algorithm for determining remaining capacity during discharge as a function of mere battery current.

SUMMARY OF THE INVENTION

It is a general object of the invention to meet the needs and to a large extent to overcome the difficulties set forth above or otherwise expressed or implicit in the course of this description.

It is a germane object of the invention to provide improved battery capacity monitoring systems.

It is a related object of the invention to enable prediction of Amp-Hour capacity of lead acid batteries during discharge and preferably during charge and float conditions.

Other objects will become apparent in the further course of this description.

The invention resides in a method of monitoring electric battery capacity, comprising, in combination, effecting evaluation of battery capacity in terms of battery current and battery voltage in a succession of monitoring cycles, scaling down an influence of battery current on the evaluation as the succession of monitoring cycles progresses, and scaling up an influence of battery voltage on such evaluation as the succession of monitoring cycles progresses.

A preferred embodiment of the invention resides in a method of monitoring electric battery capacity in a succession of monitoring cycles, comprising, in combination, effecting an assessment of battery capacity at a start of substantially each monitoring cycle, reducing such assessment in proportion to battery power withdrawal during substantially each monitoring cycle, generating over these monitoring cycles a decreasing first scale factor proportional to withdrawal of battery current since an initial monitoring cycle relative to an initial battery capacity, effecting a first modification of such reduced assessment by that first scale factor during substantially each monitoring cycle, generating a product of a battery current and a time interval during substantially each monitoring cycle, generating over the monitoring cycles a varying second scale factor proportional to a proximity of battery voltage to a nominal battery voltage, effecting a second modification of the time interval by that second scale factor during substantially each monitoring cycle, and calculating available battery capacity from these effected first and second modifications.

From a related aspect thereof the invention resides in a method of monitoring electric battery capacity in a succession of monitoring cycles, comprising, in combination, effecting an assessment of battery capacity during alternating battery discharge operations and battery charging operations over a recurrence of monitoring cycles, detecting a decline of attainable battery charge capacity during battery charging operations, and modifying the assessment in response to the detected decline of attainable battery charge capacity.

The invention resides also in a method of monitoring electric battery capacity, comprising, in combination, effecting evaluation of battery capacity during battery discharges in a succession of monitoring cycles, effecting an adjustment of such evaluation of battery capacity in a succession of further monitoring cycles during battery charge restoration between battery discharges, and effecting a modification of the adjustment during a decline of battery charging efficiency in a vicinity of full charge restoration.

BRIEF DESCRIPTION OF THE DRAWINGS

The subject invention and its various aspects and objects will become more readily apparent from the following detailed description of preferred embodiments thereof, illustrated by way of example in the accompanying drawings which also constitute a written description of the invention, wherein like reference numerals designate like or equivalent parts, and in which.

MODES OF CARRYING OUT THE INVENTION

Figure 1:
FIG. 1 is a block diagram of a method of monitoring battery capacity pursuant to a preferred embodiment of the invention.

FIG. 1 is a block diagram of a method of monitoring battery capacity pursuant to a preferred embodiment of the invention effecting evaluation of battery capacity in terms of battery current and battery voltage in a succession of monitoring cycles, such as indicated in a block 10. Such monitoring of battery capacity may be continuous.

FIG. 1 further illustrates in a block 12 a scaling down of an influence of battery current or battery current factor on the evaluation in block 10 as the succession of monitoring cycles progresses; thereby producing a first scaling factor SF1.

A scaling up an influence of battery voltage or battery voltage factor on such evaluation as the succession of monitoring cycles progresses is illustrated in a box 13, producing a second scaling factor SF2.

Both scaling factors SF1 and SF2 are made to bear on the evaluation of battery capacity, such as indicated by the lines 14 and 15 shown in FIG. 1 and as otherwise disclosed below by way of example.

While the scaling down is indicated in box 12 by a line 16, and the scaling up is indicated in box 13 by a line 17, such scaling need not be linear, but can proceed in various other functions, such as more fully disclosed below.

According to an embodiment of the invention, the scaling down symbolized by box 12 is in proportion to withdrawal of battery power since an initial monitoring cycle, such as the first monitoring cycle on the time axis, t, shown in box 10, relative to an initial battery capacity, such as the manufacturer's nominal battery capacity in the case of a new battery, or a subsequent value of an actual battery capacity determined over time in a large number of battery monitoring cycles.

In practice, the withdrawal of battery power may be determined by integrating a series of increments of battery current, i, over a time interval, $\Delta t$, from the initial monitoring cycle (e.g. the lapse of time since the initial monitoring cycle) during the particular discharge. An equation for this may be written as:

$$i \times \Delta t \qquad (1)$$

The scaling up, such as symbolized by the box 13, may be proportional to a proximity of actual battery voltage, v, to a terminal battery voltage, $v_{end}$, such as the voltage at the end of a discharge cycle. In this respect, the battery voltage may be fairly steady over most of the discharge, such as in the case of lead acid batteries, but declines as the battery approaches its tolerated discharge; that is, a discharge at which the battery remains undamaged and ready for recharging. This is to be contrasted from an intolerable battery discharge which results in a dead, damaged battery, especially in the case of lead acid batteries.

The system of FIG. 1 may be viewed in the context of the other figures and the equations set forth below. In this respect, FIG. 2 is a state transition diagram of battery management according to an embodiment of the invention.

Figure 2:
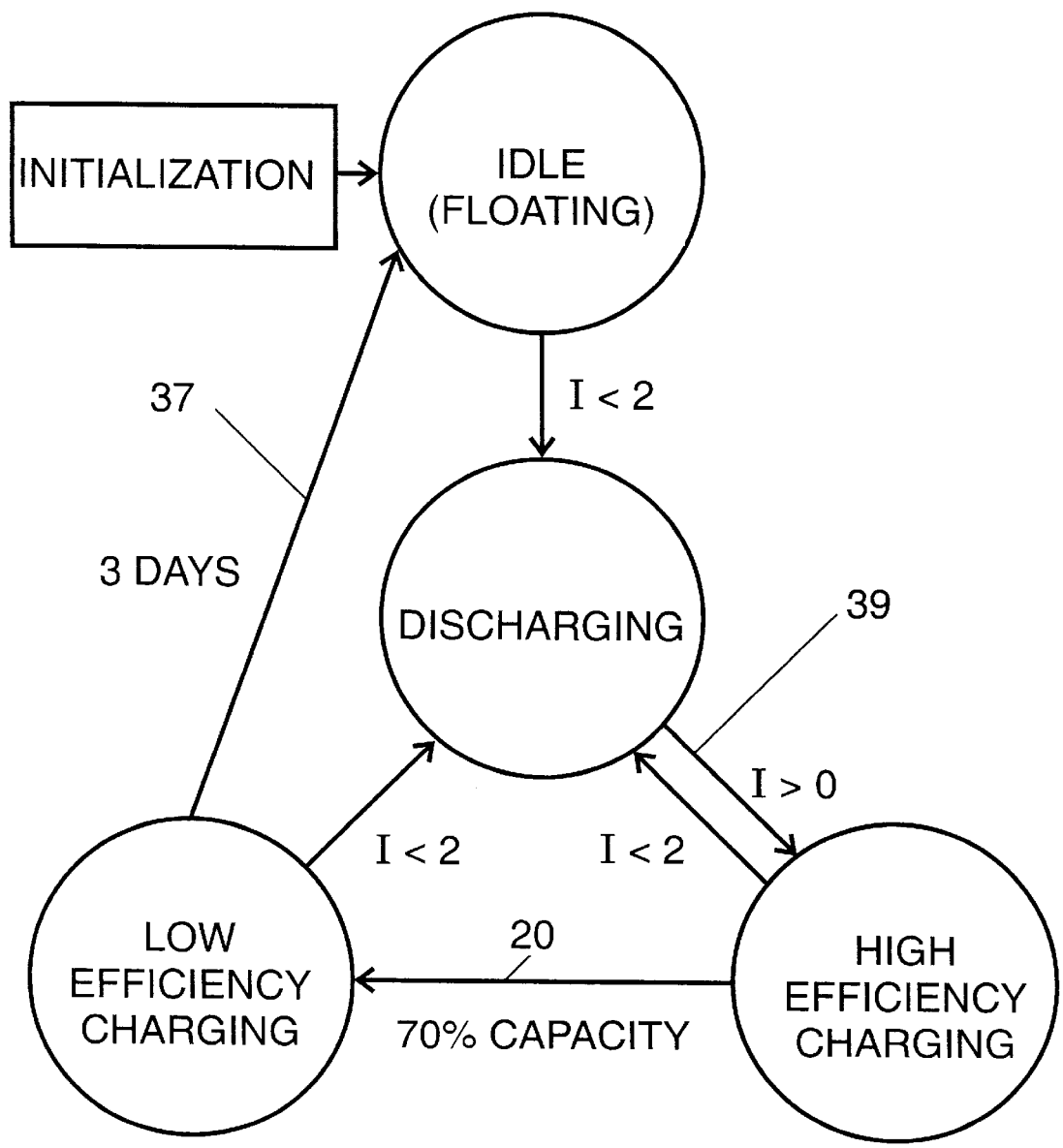
FIG. 2 is a state transition diagram of battery management useful in the practice of an embodiment of the invention.

Initialization of battery monitoring or battery capacity evaluation, such as at the start of the first one of a succession of monitoring cycles as more fully disclosed below, may be effected as indicated at the top of FIG. 2, which relates to Idle Floating or "IF" of the battery, or "trickle charging," such as indicated by a line 37.

A "battery" in this respect may include many rechargeable cells which may be subdivided in so-called "strings of batteries," having an overall "string voltage," such as referred to under "tt" below at Equation (10), but also applicable to Equations (2) and (11) for instance. Conversely, the invention and embodiments thereof work also with a single rechargeable cell, in which case the term "battery" may be considered in its modern secondary sense which in practice now covers single as well as multiple cell systems.

From the well-known Idle Floating condition symbolized at the top of FIG. 2, the system may proceed to a battery discharge, or "D" condition, such as symbolized in the center of FIG. 2 and dealt with in FIG. 1 described above, and in FIG. 3 and in Equations (2), (3), (8), (9), (10) and (11) and their contexts set forth below.

Pursuant to the embodiment illustrated in FIG. 2, typical restoration of battery charge after discharge first takes place as high-efficiency charging or "HIGH EFFICIENCY CHARGING," being "HEC" for short, to be followed by low-efficiency charging or "LOW EFFICIENCY CHARGING," being "LEC" for short, as symbolized at the bottom of FIG. 2. Reference may in this respect be had to Equation (4) and its context, and then to FIG. 4 and its context with Equations (5) and (6) explaining the "70% capacity" label in FIG. 2 and its broader implications within the scope of the invention, symbolized by a line 20 in FIG. 2.

It may be noted in this respect, that the phrase "LOW EFFICIENCY CHARGING," such as symbolized at the lower left-hand corner of FIG. 2, does in no manner imply a waste of energy through substandard charging operations or otherwise. To the contrary, that expression refers to a novel feature of the invention in battery capacity monitoring, that restores battery capacity assessment and prediction in an important manner where the prior art had failed, such as apparent below from the text prefacing Equation (4) and also with reference to FIG. 4 and Equations (5) to (12).

Figure 3:
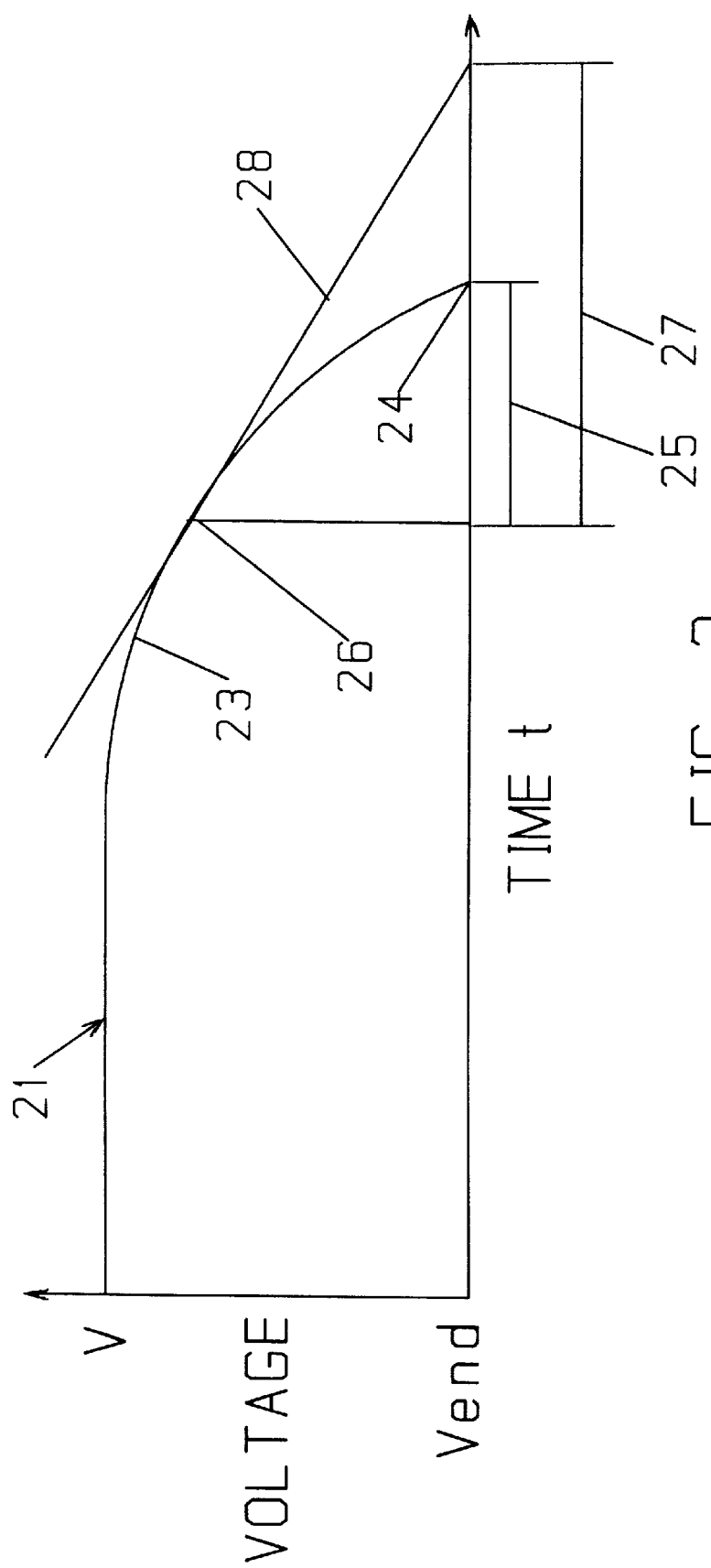
FIG. 3 is a graph of battery voltage, v, versus time, t, into battery discharge.

Focusing now on the center of FIG. 2, reference may be had to FIG. 3 which depicts a graph of battery voltage, v, versus time, t, into the discharge. As shown by the horizontal line 21 in FIG. 3, the battery voltage remains fairly constant until the battery starts to approach an end of its discharge cycle. The battery voltage then starts to follow a declining curve 23. A point 24 in FIG. 3 indicates the end of a discharge cycle. The battery voltage at this point may be considerably above zero, since most batteries would be severely damaged by a total discharge. By way of example, a typical remaining battery voltage would be on the order of 1.75 volts per cell in the case of lead acid batteries which must never become or remain totally discharged. Generally speaking, the battery voltage at point 24 may be the terminal battery voltage, $v_{end}$, mentioned above in the context of Equation (1) and in text below Equation (3). Such terminal battery voltage is also implied in the term "tt" below Equation (10) and thereby in the term "tf" in Equations (10) and (11) below.

A line 25 in FIG. 3 represents remaining battery discharge time, such as the time that remains for discharge of the battery from a battery voltage value 26 relevant to the above mentioned battery voltage slope, s, to the above mentioned point 24 or terminal battery voltage, $v_{end}$. A line 27 in FIG. 3 represents twice that remaining battery discharge time. The hypotenuse of such voltage and time values 26 and 27 defines a tangent 28 that represents battery voltage slope, s, such as indicated below in Equation (2).

Against such background, the proximity mentioned above after Equation (1) may be determined by dividing the time interval, t1, or total time into the discharge, from an initial monitoring cycle by a sum of that time interval and an actual value of battery voltage, v, above the above mentioned terminal battery voltage, $v_{end}$, divided by substantially twice a battery voltage slope, s, during battery discharge. Such battery voltage slope, s, may be a time derivative of the actual battery voltage, v, such as $$\Delta v / \Delta t \qquad (2)$$

According to an embodiment of the invention, the evaluation such as symbolized by block 10 includes effecting an assessment of battery capacity, $C_{mc}$, at a start of substantially each monitoring cycle and reducing such assessment in proportion to battery current withdrawal, such as to the integral of current over time, during substantially each monitoring cycle. This may be expressed by the following equation:

$$C_{mc} - (i \times \Delta t) \tag{3}$$

As the succession of monitoring cycles progresses during a discharge, the assessment according to Equation (3) may be scaled down, such as herein explained with the aid of or by reference to box 12 and scale factor SF1.

Alternatively or additionally, evaluation may include generation of a product of a battery current and a time interval during substantially each monitoring cycle. Similar techniques may be used for such evaluation as for the above mentioned scaling up process which by way of example has been symbolized by the box 13.

As there, the time interval currently under consideration for the evaluation of battery capacity may include actual battery voltage, v, above a terminal battery voltage, $v_{end}$, divided by substantially twice a battery voltage slope, s, during battery discharge, wherein such slope may be as defined above with the aid of Equation (2).

The above mentioned product of a battery current and time interval may be scaled up during substantially each monitoring cycle in proportion to a proximity of actual battery voltage to a terminal battery voltage, such as herein explained with the aid of or by reference to box 13.

Combining such teachings, a composite method of monitoring electric battery capacity in a succession of monitoring cycles according to an embodiment of the invention comprises effecting an assessment of battery capacity, $C_{mc}$, at a start of substantially each monitoring cycle, reducing such assessment in proportion to battery power withdrawal, such as represented above by Equation (3), during substantially each monitoring cycle, generating over such monitoring cycles a decreasing first scale factor, SF1, proportional to withdrawal of battery power since an initial monitoring cycle relative to an initial battery capacity, effecting a first modification of the reduced assessment mentioned in this paragraph by the mentioned first scale factor, SF1, during substantially each monitoring cycle, generating a product of a battery current and a time interval during substantially each monitoring cycle, such as explained above, generating over these monitoring cycles a varying second scale factor, SF2, proportional to a proximity of battery voltage, v, to a terminal battery voltage, $v_{end}$, effecting a second modification of the time interval mentioned in this paragraph by such second scale factor, SF2, during substantially each monitoring cycle, and calculating available battery capacity from such effected first and second modifications.

Such or any other evaluation of battery capacity herein disclosed may be employed to initiate battery recharging during battery discharges when needed.

Further evaluation of battery capacity may be effected in further monitoring cycles during the battery charging operation. Focusing on the lower part of FIG. 2 and on Equations (4) to (12) below, preferred embodiments of the invention effect an adjustment of battery capacity evaluation in a succession of further monitoring cycles during battery recharging between battery discharges. Such adjustment is particularly needed to improve evaluation of battery capacity in case of battery discharges after partial battery recharging. In this respect, prior-art efforts at predicting battery capacity became particularly inaccurate when battery discharges occurred before the battery was fully recharged, as is regularly the case in many practical applications of battery power.

The currently discussed aspect of the invention thus is particularly useful to improve evaluation of battery capacity in case of battery discharges after partial battery charge restoration.

Within the scope of the invention, battery recharging may be continued toward restoration of a full battery charge. Pursuant to embodiments of the invention, battery discharge may, however, resume before full battery charge restoration has occurred.

The above mentioned further evaluations or adjustment during battery charge restoration according to an embodiment of this aspect of the invention includes effecting an assessment of battery capacity, $C_{mc}$, at the start of each further monitoring cycle and effecting an augmentation of such assessment in proportion to battery current addition or charging current integral during battery charge restoration, such as according to the equation $$C_{mc} + (i \times \Delta t) \tag{4}$$

wherein:

$C_{mc}$ now denotes battery capacity at the beginning of the particular monitoring cycle, i denotes charging current, and $\Delta t$ denotes an interval of time from initiation of that battery charge restoration.

It may be noted that this Equation (4) is a complement of Equation (3), moving in a positive or accretive direction instead of in a negative or depletive sense.

A preferred embodiment of the invention effects a modification of the above mentioned adjustment during a decline of battery charging efficiency in a vicinity of full charge restoration. By way of example, the above mentioned adjustment of the evaluation of battery capacity during battery charge restoration includes effecting an assessment of battery capacity at the start of each further monitoring cycle and effecting an augmentation of that assessment in proportion to battery current addition during such battery charge restoration. Such augmentation of assessment may be lowered in a vicinity of full charge restoration. Preferably, the rate of that augmentation of the assessment of battery capacity is lowered in the vicinity of a decrease in battery charging efficiency during battery charge restoration. For example, such rate may correspond to a decrease in charging efficiency as the charging operation approaches a full charge restoration.

Figure 4:
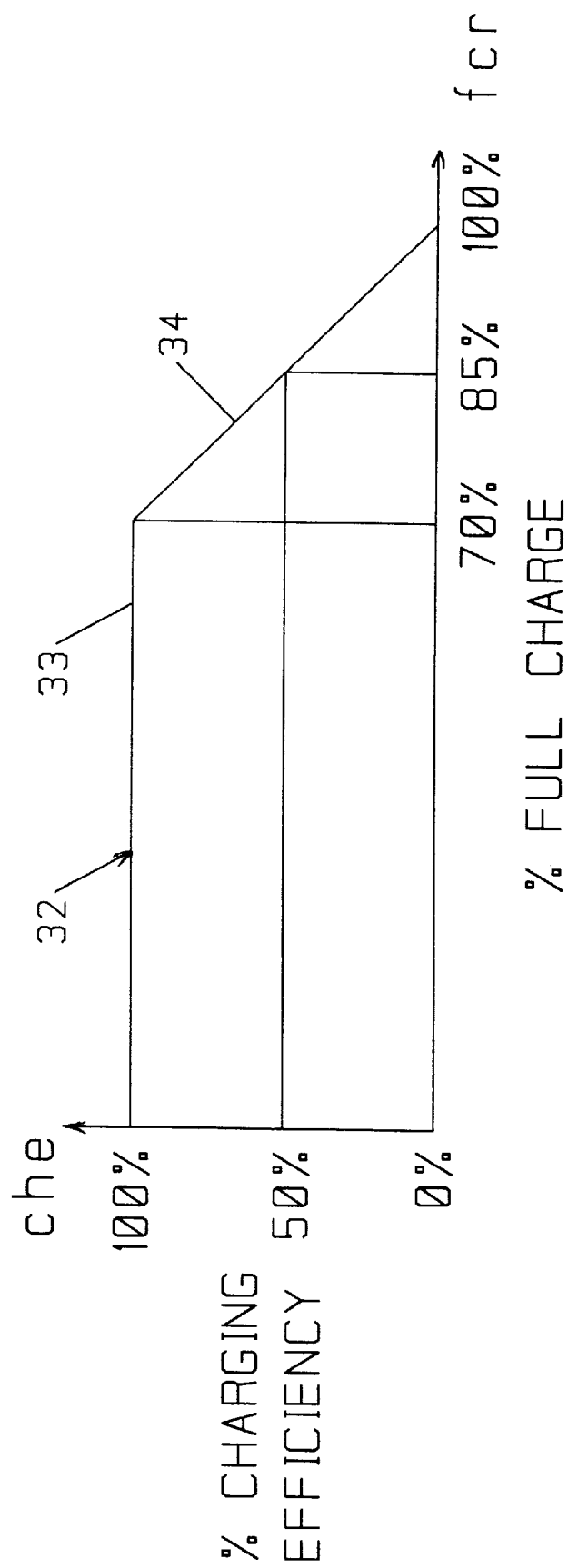
FIG. 4 shows a plot of percentage of charging efficiency, che, versus percentage of full charge capacity, fcr.

To provide an illustration, FIG. 4 shows a plot which estimates the percentage of charging efficiency, che, versus percentage of full charge restoration, or fcr. In this respect, the term "full charge capacity" could be used instead, as "charge restoration" and "capacity" to some extent have been used interchangeably in prior-art parlance as well as herein, since "capacity" as an indication of storage capability (the Ampere-Hour property of the battery) may in effect be synonymous with capacity as an indication of state of battery charge when the battery is fully charged.

However, the term "full charge restoration" is preferred at this point in an effort to avoid confusion with the term "capacity" as an indication of storage capability, as distinguished from the energy actually stored in the battery at the particular time, such as eventually at full charge of the battery.

As shown by the horizontal portion 33 of the curve 32 in FIG. 4, the charging cycle is expected to proceed at 100% efficiency for better than half of the charging cycle. However, as indicated by the declining branch 34 of the charging curve 32, efficiency starts to drop as the charging cycle approaches full charge restoration. FIG. 4 models the start of a significant decline of battery charging efficiency at 70% and the drop of such charging efficiency to one half or 50% at 85% of full charge restoration. FIG. 4 thus depicts a specific embodiment wherein the rate of augmentation of the assessment of battery capacity is lowered when battery charge restoration has reached substantially seventy percent of anticipated full charge restoration.

While that is typical for certain lead acid batteries, it is, of course, a fact that different kinds of batteries have different characteristics and that the 50% and 70% values given in FIG. 4 may have to be adjusted according to the characteristic of the kind of battery used. However, the principle of this aspect of the invention remains the same; namely, that the assessment of battery capacity is lowered in a vicinity of full charge restoration. In this respect, "vicinity" means 70% in terms of FIG. 4, but more generally denotes the start of a decrease in charging efficiency which is significant to the battery capacity assessments herein dealt with.

Accordingly, the rate of augmentation of the assessment of battery capacity, such as in Equation (4), is lowered in a vicinity of a decrease in battery charging efficiency during the charging operation. In more general terms, such augmentation is scaled down in that vicinity pursuant to a ratio of a difference between (A) the assessed capacity during charge restoration and the point at which the charging efficiency begins to be reduced, and (B) an anticipated charge needed above this point for full battery charge restoration. According to an embodiment of the invention, the augmentation under consideration is scaled down in that vicinity by a scale factor substantially equal to $$1 - A/B, \quad (5)$$

wherein A is a difference between the assessed capacity during charge restoration and the point at which the charging efficiency begins to be reduced, and B is an anticipated charge needed above that point for full battery charge restoration.

For typical lead-acid batteries in many telephone exchanges and other installations, the augmentation under consideration is scaled down in the mentioned vicinity by a scale factor substantially equal to $$1 - A.7/B.3 \quad (6)$$

wherein A.7 is a difference between assessed battery capacity during charge restoration and seventy percent of anticipated full charge restoration, and B.3 is equal to thirty percent of anticipated full charge restoration.

Within the scope of the invention, capacity as an indication of storage capability (the Ampere-Hour property of the battery) may in effect be synonymous with capacity as an indication of state of battery charge when the battery is fully charged. This fact is exploited by an embodiment of the invention which adjusts the assessment of battery capacity, C, in equation (3) and preferably also in equation (4) for greater accuracy of such monitoring processes, and thereby greatly improved valuation of actual battery capacity, both in terms of state of charge and in terms of storage capability.

The following example may be helpful:

Suppose a certain battery has a capacity in terms of storage capability of 100 AH when new. After many discharge and charging cycles, such capacity may drop to 90 AH and eventually to 80 AH over time, when that 100 AH rated battery in fact cannot be charged to more than 80 AH; that is, eighty percent of its original rating.

Under these circumstances, maintaining C in equation (3) as rated capacity of 100 AH throughout all monitoring operations on that battery could produce highly inaccurate assessments not only of storage capability but also of state of battery charge over longer periods of time. This not only would make it difficult to ascertain whether there is sufficient charge in that battery for a given task, but would also render it impossible to start battery recharging automatically at the optimum point of time for best overall results.

Accordingly, a preferred embodiment of the invention that monitors electric battery capacity in a succession of monitoring cycles, effects an evaluation of battery capacity during alternating battery discharges and battery charge restorations over recurring monitoring cycles, detects a decline of attainable battery charge restoration during such recurring monitoring cycles, and modifies such evaluation of battery capacity in response to such detected decline of attainable battery charge capacity.

On the basis of these teachings, those skilled in the art may design and implement hardware and software capable of monitoring electric battery capacity in the manner herein disclosed. Method steps herein disclosed may be incorporated in an algorithm that may implement equations herein disclosed. An operator may initialize such algorithm during system setup, such as indicated at the top of FIG. 2, and initial capacity predictions may be based on such initial value. After battery discharge, the algorithm updates this initialized value based on the battery's or batteries' actual performance. Hence the algorithm learns from each discharge and its evaluations, assessments or predictions of battery capacity become more accurate.

Inputs to such algorithm are battery voltage and current and last performance data, and preferably also battery temperature. Battery current may be monitored with a battery current shunt. Battery voltage may be picked up with a Battery Post Sensor (BPS) that in a manner known per se samples voltage and preferably also temperature of batteries. Such values may be fed to a microprocessor.

While neither the invention nor its preferred embodiments are limited to a particular algorithm, the following may be helpful on that subject:

During discharge, battery capacity or charge restoration may be calculated and recalculated as follows:

$$C_{mc} = SF1 * Est1 + SF2 * Est2 \quad (7)$$

wherein:

$C_{mc}$ may be as in Equation (3) above in recurrence over successive monitoring cycles, SF1 may be the scaling factor disclosed above with reference to FIG. 1, Box 12, and Equation (3), SF2 may be the scaling factor disclosed above with reference to FIG. 1, Box 13, Equation (2) and FIG. 3, Est1 may be a first-cut estimate which may be based solely on the estimated battery capacity at the start of discharge minus the total power removed (integral of current over time) since the start of discharge, such as explained above with reference to Equation (3).

Pursuant to standard programming practice, the asterisk (*), such as in Equations (7), (8) and (10) may denote multiplication.

By way of example, Est1 may be initialized at start of discharge to the estimated capacity of the batteries at that moment. Est1 then is reduced during successive monitoring cycles, such as every 5 minutes, for example, by an amount equal to the power removed from the batteries during that time (integral of current over time), such as in Equation (3).

Accordingly, $$Est1 = Est1_{start} - current*\Delta t \qquad (8)$$

SF1, such as for the box 12 in FIG. 1 and for Equation (7), may be initialized to 100% at the start of discharge, and reduced as power is removed from the batteries. When the amount of power removed from the batteries equals the amount of power at the start of discharge SF1 is equal to 0%.

According to an embodiment of the invention, $$SF1 = 1 - t1/tm \qquad (9)$$

wherein:

t1 is total time into discharge, and tm=capacity at start of discharge divided by battery current at this moment.

Such tm may be calculated each pass through the algorithm or monitoring cycle. This provides capability of accurately predicting the remaining time to battery exhaustion, even as loads are shed.

Est2 is also initialized at the start of discharge to the estimated capacity at that moment. Est2 may be recalculated each pass through the algorithm or monitoring cycle and may increase or decrease.

By way of example, $$Est2 = \text{battery current at this moment}*tf \qquad (10)$$

wherein:

tf=tt/2, where, tt=(string voltage at this moment−1.75 volts*number of cells per string)/slope, wherein:

slope=Δstring voltage/Δtime, with "string" referring to a number of series-connected batteries, and a slant (/) denoting arithmetic division.

SF2, such as for the box 13 in FIG. 1 and Equation (7), may be initialized to 0% and recalculated each pass through the algorithm or monitoring cycle, and may increase or decrease with each calculation. Just as SF1 is proportional to how much power has been removed since start of discharge relative to the starting capacity, SF2 is proportional to how close the battery string voltage is to the end of capacity voltage, such as 1.75 VPC (volts per cell) in the case of typical lead-acid batteries.

Accordingly, we may obtain $$SF2 = t1/(tf + t1) \qquad (11)$$

wherein t1 and tf may be as defined above in the context of Equations (9) and (10).

After a discharge, a batteries charge cycle may begin. A full charging cycle, such as discussed above with reference to the lower part of FIG. 2, including line 20, may extend over a longer period of time, such as two or more days in the case of large battery systems. Accordingly, as indicated above, it is possible that battery power is needed prior to completion of the charging cycle. Another discharge, such as indicated at the central portion of FIG. 2, thus is likely to occur in practice prior to the batteries being fully charged back up. For this reason, preferred embodiments of the subject invention recalculate estimated capacity of the batteries during charging as well as during discharging. When a battery is deeply discharged, it recharges with almost perfect efficiency. As a battery becomes more fully charged its charging characteristics become less efficient, as explained above with the aid of FIG. 4.

According to an embodiment of the invention relating to battery charge restoration, restored battery charge, $C_r$, is equal to $$C_r = C_{mc} + i*\Delta t*SF3 \qquad (12)$$

wherein:

$C_{mc}$ may now be as in Equation (4) above in recurrence over successive monitoring cycles, i=battery charging current SF3 is a scale factor for battery charge restoration, such as explained above in the context of FIG. 4, and Equations (4), (5) and (6).

Battery charge condition of beginning of a battery charge restoration may be set equal to the battery charge condition at the end of the preceding discharge on a discharge-to-charge state transition such as indicated by the line 39 in FIG. 2. The anticipated full charge capacity may also be calculated on a discharge-to-charge state transition. It may be initialized to an estimated remaining capacity plus what has actually been removed.

This extensive disclosure will render apparent or suggest to those skilled in the art various modifications and variations within the spirit and scope of the invention.

We claim:

1. A method of monitoring electric battery capacity, comprising in combination:

effecting evaluation of battery capacity in terms of battery current and battery voltage in a succession of monitoring cycles;

scaling down an influence of said battery current on said evaluation as said succession of monitoring cycles progresses; and scaling up an influence of said battery voltage on said evaluation as said succession of monitoring cycles progresses.

2. A method as in claim 1, wherein:

said scaling down is in proportion to withdrawal of battery power since an initial monitoring cycle relative to an initial battery capacity.

3. A method as in claim 2, wherein:

said withdrawal of battery power is determined by integrating a series of increments of battery current over a time interval from said initial monitoring cycle.

4. A method as in claim 2, wherein:

said scaling up is proportional to a proximity of actual battery voltage to a terminal battery voltage.

5. A method as in claim 1, wherein:

said scaling up is proportional to a proximity of actual battery voltage to a terminal battery voltage.

6. A method as in claim 5, wherein:

said proximity is determined by dividing a time interval from an initial monitoring cycle by a sum of said time interval and an actual value of battery voltage above a terminal battery voltage divided by substantially twice a battery voltage slope during battery discharge.

7. A method as in claim 1, wherein:

said evaluation includes effecting an assessment of battery capacity at a start of substantially each monitoring cycle and reducing said assessment in proportion to battery power withdrawal during substantially each monitoring cycle.

8. A method as in claim 7, wherein:

said scaling down includes a scaling down of said reduced assessment in proportion to withdrawal of battery power since an initial monitoring cycle relative to an initial battery capacity.

9. A method as in claim 8, wherein:

said withdrawal of battery power is determined by integrating a series of increments of battery current over time intervals from said initial monitoring cycle.

10. A method as in claim 1, wherein:

said evaluation includes generating a product of a battery current and a time derivative of battery voltage during substantially each monitoring cycle.

11. A method as in claim 10, wherein:

said time derivative includes actual battery voltage above a terminal battery voltage divided by substantially twice a battery voltage slope during battery discharge.

12. A method as in claim 11, wherein:

said slope is a time derivative of said actual battery voltage.

13. A method as in claim 10, wherein:

said scaling up includes a scaling up of said product in proportion to a proximity of actual battery voltage to a terminal battery voltage.

14. A method as in claim 13, wherein:

said proximity is determined by dividing a time interval from an initial monitoring cycle by a sum of said time interval and an actual value of battery voltage above a terminal battery voltage divided by substantially twice a battery voltage slope during battery discharge.

15. A method as in claim 1, wherein:

said evaluation includes effecting an assessment of battery capacity at a start of substantially each monitoring cycle and reducing said assessment in proportion to battery power withdrawal during substantially each monitoring cycle, and generating a product of a battery current and a time derivative of battery voltage during substantially each monitoring cycle.

16. A method as in claim 15, wherein:

said scaling down includes a scaling down of said reduced assessment in proportion to withdrawal of battery power since an initial monitoring cycle relative to an initial battery capacity.

17. A method as in claim 16, wherein:

said withdrawal of battery power is determined by integrating a series of battery current increments over a time interval from said initial monitoring cycle.

18. A method as in claim 15, wherein:

said time derivative includes actual battery voltage above a terminal battery voltage divided by substantially twice a battery voltage slope during battery discharge.

19. A method as in claim 18, wherein:

said slope is a time derivative of said actual battery voltage.

20. A method as in claim 15, wherein:

said scaling up includes a scaling up of said product in proportion to a proximity of actual battery voltage to a terminal battery voltage.

21. A method as in claim 20, wherein:

said proximity is determined by dividing a time interval from an initial monitoring cycle by a sum of said time interval and an actual value of battery voltage above a terminal battery voltage divided by substantially twice a battery voltage slope during battery discharge.

22. A method as claimed in claim 1, wherein:

said evaluation of battery capacity is employed to initiate a battery charging operation.

23. A method as in claim 22, wherein:

said battery charging operation is continued toward restoration of a full battery charge.

24. A method as in claim 22, wherein:

a further evaluation of battery capacity is effected in further monitoring cycles during said battery charging operation.

25. A method as in claim 24, wherein:

said further evaluation of battery capacity includes effecting an assessment of battery capacity at the start of each further monitoring cycle and effecting an augmentation of such assessment in proportion to battery power addition during said battery charging operation.

26. A method as in claim 25, wherein:

a rate of said augmentation of said assessment of battery capacity is lowered in a vicinity of full charge capacity.

27. A method as in claim 25, wherein:

said augmentation of said assessment of battery capacity is lowered in a vicinity of full charge capacity at a rate corresponding to a decrease in charging efficiency as said charging operation approaches a full charge capacity.

28. A method as in claim 25, wherein:

a rate of said augmentation of said assessment of battery capacity is lowered in a vicinity of a decrease in battery charging efficiency during said charging operation.

29. A method as in claim 25, wherein:

a rate of said augmentation of said assessment of battery capacity is lowered when the battery charging operation has effected battery charging on the order of seventy percent of a full battery charge.

30. A method as in claim 24, wherein:

said further evaluation of battery capacity includes effecting an assessment of battery capacity at the start of each further monitoring cycle, effecting an augmentation of such assessment in proportion to battery power addition during said battery charging operation, and scaling down such augmentation in a vicinity of a decrease in battery charging efficiency pursuant to a ratio of a difference between (A) the assessed capacity during charge restoration and a point at which the charge efficiency begins to be reduced, and (B) an anticipated charge needed above said point for full battery charge restoration.

31. A method of monitoring electric battery capacity in a succession of monitoring cycles, comprising in combination:

effecting an assessment of battery capacity during alternating battery discharge operations and battery charging operations over a recurrence of said monitoring cycles;

detecting a decline of attainable battery charge capacity during said battery charging operations; and modifying said assessment in response to said detected decline of attainable battery charge capacity.

32. A method of monitoring electric battery capacity in a succession of monitoring cycles, comprising in combination:

effecting an assessment of battery capacity at a start of substantially each monitoring cycle; reducing said assessment in proportion to battery power withdrawal during substantially each monitoring cycle;

generating over said monitoring cycles a decreasing first scale factor proportional to withdrawal of battery power since an initial monitoring cycle relative to an initial battery capacity;

effecting a first modification of said reduced assessment by said first scale factor during substantially each monitoring cycle;

generating a product of a battery current and a time derivative of battery voltage during substantially each monitoring cycle;

generating over said monitoring cycles a varying second scale factor proportional to a proximity of battery voltage to a terminal battery voltage;

effecting a second modification of said time derivative by said second scale factor during substantially each monitoring cycle; and calculating available battery capacity from said effected first and second modifications.

33. A method as in claim 32, wherein:

said withdrawal of battery power is determined by integrating a series of battery current increments over a time interval from said initial monitoring cycle.

34. A method as in claim 32, wherein:

said time derivative includes actual battery voltage above a terminal battery voltage divided by substantially twice a battery voltage slope during battery discharge.

35. A method as in claim 34, wherein:

said slope is a time derivative of said actual battery voltage.

36. A method as in claim 32, wherein:

said scaling up includes a scaling up of said product in proportion to a proximity of actual battery voltage to a terminal battery voltage.

37. A method as in claim 36, wherein:

said proximity is determined by dividing a time interval from an initial monitoring cycle by a sum of said time interval and an actual value of battery voltage above a terminal battery voltage divided by substantially twice a battery voltage slope during battery discharge.

38. A method of monitoring electric battery capacity, comprising in combination:

effecting evaluation of battery capacity during battery discharges in a succession of monitoring cycles;

effecting an adjustment of said evaluation of battery capacity in a succession of further monitoring cycles during battery charge restoration between battery discharges; and effecting a modification of said adjustment during a decline of battery charging efficiency in a vicinity of full charge restoration.

39. A method as in claim 38, including:

effecting evaluation of battery capacity in terms of battery current and battery voltage in a succession of monitoring cycles during battery discharges;

scaling down an influence of said battery current on said evaluation as said succession of monitoring cycles progresses; and scaling up an influence of said battery voltage on said evaluation as said succession of monitoring cycles progresses.

40. A method as in claim 38, wherein:

said evaluation of battery capacity is employed to initiate battery charge restoration during battery discharges.

41. A method as in claim 38, wherein:

said modification of said adjustment is employed to improve evaluation of battery capacity in case of battery discharges after partial battery charge restoration.

42. A method as in claim 38, wherein:

said battery charge restoration is continued toward restoration of a full battery charge.

43. A method as in claim 38, wherein:

said adjustment includes effecting an assessment of battery capacity at the start of each further monitoring cycle and effecting an augmentation of said assessment in proportion to battery current addition during said battery charge restoration.

44. A method as in claim 43, wherein:

said augmentation of said assessment of battery capacity is lowered in a vicinity of full charge restoration.

45. A method as in claim 43, wherein:

a rate of said augmentation of said assessment of battery capacity is lowered in a vicinity of a decrease in battery charging efficiency during said battery charge restoration.

46. A method as in claim 45, wherein:

said rate corresponds to a decrease in charging efficiency as said battery charge restoration approaches a full charge restoration.

47. A method as in claim 45, wherein:

said augmentation is scaled down in said vicinity pursuant to a ratio of a difference between (A) the assessed capacity during charge restoration and a point at which the charge efficiency begins to be reduced, and (B) an anticipated charge needed above said point for full battery charge restoration.

48. A method as in claim 45, wherein:

said augmentation is scaled down in said vicinity by a scale factor substantially equal to $$1 - A/B$$

wherein A is an assessed capacity during charge restoration and a point at which the charge efficiency begins to be reduced, and B is an anticipated charge needed in said vicinity for full battery charge restoration.

49. A method as in claim 45, wherein:

said augmentation is scaled down in said vicinity by a scale factor substantially equal to $$1 - A.7/B.3$$

wherein A.7 is a difference between assessed battery capacity during charge restoration and seventy percent of anticipated full charge restoration, and B.3 is equal to thirty percent of anticipated full charge restoration.

50. A method as in claim 45, wherein:

a rate of said augmentation of said assessment of battery capacity is lowered when battery charge restoration has reached substantially seventy percent of anticipated full charge restoration.

51. A method as in claim 38, including:

effecting an evaluation of battery capacity during alternating battery discharges and battery charge restorations over recurring monitoring cycles;

detecting a decline of attainable battery charge restoration during said recurring monitoring cycles; and modifying said evaluation of battery capacity in response to said detected decline of attainable battery charge capacity.

\* \* \* \* \*